United States Patent
Ko et al.

(10) Patent No.: US 8,785,224 B2
(45) Date of Patent: Jul. 22, 2014

(54) ORGANIC LIGHT EMITTING DISPLAY APPARATUS AND METHOD OF MANUFACTURING THE SAME

(75) Inventors: Moo Soon Ko, Yongin (KR); Hee-Seong Jeong, Yongin (KR); Chi Wook An, Yongin (KR); Ok-Byoung Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 393 days.

(21) Appl. No.: 13/029,617

(22) Filed: Feb. 17, 2011

(65) Prior Publication Data
US 2011/0233569 A1 Sep. 29, 2011

(30) Foreign Application Priority Data
Mar. 29, 2010 (KR) .................. 10-2010-0028082

(51) Int. Cl.
*H01L 21/44* (2006.01)
(52) U.S. Cl.
USPC ............ 438/34; 438/99; 257/88; 257/40; 257/E51.018; 257/E51.022; 257/E25.001; 257/E25.003; 257/E25.008; 257/E25.012; 257/E51.019

(58) Field of Classification Search
None
See application file for complete search history.

(56) References Cited

U.S. PATENT DOCUMENTS

| | | | |
|---|---|---|---|
| 2002/0070197 A1* | 6/2002 | Ahn et al. | 216/13 |
| 2006/0118788 A1* | 6/2006 | Park | 257/72 |
| 2006/0119258 A1* | 6/2006 | Sakata et al. | 313/504 |
| 2007/0063645 A1* | 3/2007 | Yokoyama | 313/506 |
| 2007/0102737 A1* | 5/2007 | Kashiwabara et al. | 257/291 |
| 2009/0009064 A1* | 1/2009 | Lee et al. | 313/504 |
| 2009/0298377 A1* | 12/2009 | Yamazaki et al. | 445/52 |

FOREIGN PATENT DOCUMENTS

| | | |
|---|---|---|
| KR | 10-2003-0044565 | 6/2003 |
| KR | 10-2007-0063067 | 6/2007 |
| KR | 10-0729042 | 6/2007 |
| KR | 10-0783359 | 12/2007 |

* cited by examiner

*Primary Examiner* — Fei Fei Yeung Lopez
(74) *Attorney, Agent, or Firm* — Robert E. Bushnell, Esq.

(57) ABSTRACT

An organic light emitting display apparatus and method of manufacturing the same to improve an image quality of the organic light emitting display apparatus. The organic light emitting display apparatus includes: a first electrode formed on a substrate; an intermediate layer disposed on the first electrode, the intermediate layer having an organic emission layer; and a second electrode formed on the intermediate layer, wherein the first electrode includes an etching unit facing the intermediate layer.

11 Claims, 6 Drawing Sheets

ORGANIC LIGHT EMITTING DISPLAY APPARATUS AND METHOD OF MANUFACTURING THE SAME

CROSS-REFERENCE TO RELATED APPLICATION

This application claims the benefit of Korean Patent Application No. 10-2010-0028082, filed Mar. 29, 2010, in the Korean Intellectual Property Office, the disclosure of which is incorporated herein by reference.

BACKGROUND

1. Field

Aspects of the present invention relate to an organic light emitting display apparatus and a method of manufacturing the same, and more particularly, to an organic light emitting display apparatus which improves an image quality and a method of manufacturing the same.

2. Description of the Related Art

Portable and thin flat display apparatuses are increasing in use. Organic or inorganic light emitting display apparatuses are types of the thin flat display apparatuses. They are self-emissive display apparatuses that have wide viewing angles, excellent contrast, and rapid response speed. Thus, the organic or inorganic light emitting display apparatuses have been highlighted as next generation display apparatuses. Also, organic light emitting display apparatuses including an emission layer formed of an organic material have excellent properties in terms of brightness, driving voltages, and response speed compared with those of inorganic light emitting display apparatuses, and may display various colors.

The organic light emitting display apparatus includes a first electrode, a second electrode, and an organic emission layer interposed therebetween. If voltages are applied to both electrodes, visible rays are emitted from the organic emission layer that is connected to both electrodes. The first electrode is generally patterned in a predetermined form. However, during the patterning of the first electrode, a portion to be removed is not completely removed and remains on the surface of the first electrode. Such a residual pattern may cause defects such as a dark spot during operating the organic light emitting display apparatus. Thus it may be difficult to improve an image quality property of the organic light emitting display apparatus.

SUMMARY

Aspects of the present invention provide an organic light emitting display apparatus which may easily improve an image quality property and a method of manufacturing the same.

According to aspects of the present invention, there is provided an organic light emitting display apparatus including: a first electrode formed on a substrate; an intermediate layer disposed on the first electrode, the intermediate layer having an organic emission layer; and a second electrode formed on the intermediate layer, wherein the first electrode includes an etching unit facing the intermediate layer.

According to another aspect of the present invention, the apparatus may further include a pixel defining layer disposed on the first electrode and exposing a predetermined area of the first electrode, wherein the etching unit is formed on the exposed area of the first electrode.

According to another aspect of the present invention, the first electrode may include silver (Ag).

According to another aspect of the present invention, an area of the first electrode having the etching unit may be crystallized.

According to another aspect of the present invention, an area of the first electrode having the etching unit may include crystallized ITO.

According to another aspect of the present invention, the first electrode may include a first conductive layer; a second conductive layer; and a third conductive layer, wherein the first electrode is formed in a stacked structure stacking the first conductive layer, the second conductive layer and the third conductive layer, wherein the first conductive layer and the third conductive layer include ITO and wherein the second conductive layer includes silver (Ag).

According to another aspect of the present invention, the etching unit may be formed on the third conductive layer.

According to aspects of the present invention, there is provided a method of manufacturing an organic light emitting display apparatus, the method including: forming a first electrode on a substrate; forming an intermediate layer on the first electrode, the intermediate layer having an organic emission layer; and forming a second electrode on the intermediate layer, wherein the first electrode includes an etching unit facing the intermediate layer.

According to another aspect of the present invention, the method may further include: forming a pixel defining layer on the first electrode so as to expose a predetermined area of the first electrode after forming the first electrode and before forming the intermediate layer; and forming the etching unit by etching the exposed area of the first electrode.

According to another aspect of the present invention, the etching unit may be formed by wet etching the first electrode.

According to another aspect of the present invention, the etching unit may be formed by an oxalic acid.

According to another aspect of the present invention, the first electrode may include silver (Ag).

According to another aspect of the present invention, the method may further include crystallizing the surface of the first electrode before forming the etching unit on the first electrode.

According to another aspect of the present invention, a surface of the first electrode may include ITO and wherein the crystallizing of the first electrode comprises crystallizing ITO.

According to another aspect of the present invention, the crystallizing the surface of the first electrode may be performed by a heat treatment.

According to another aspect of the present invention, the first electrode may include a first conductive layer; a second conductive layer; and a third conductive layer, wherein the first electrode is formed in a stacked structure stacking the first conductive layer, the second conductive layer, and the third conductive layer, wherein the first conductive layer and the third conductive layer include ITO and wherein the second conductive layer includes silver (Ag).

According to another aspect of the present invention, the etching unit may be formed on the third conductive layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
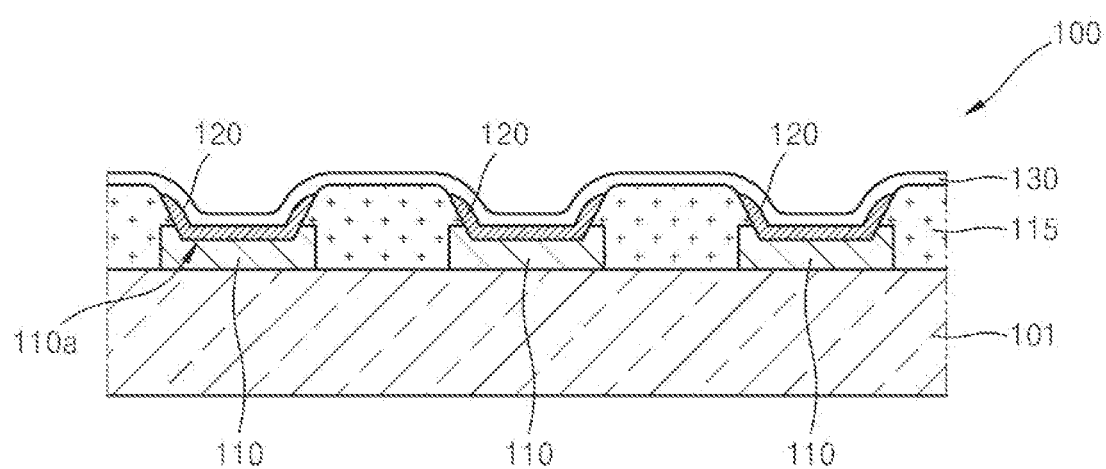
FIG. 1 is a cross-sectional diagram of an organic light emitting display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

It is to be understood that where is stated herein that one element, film or layer is "formed on" or "disposed on" a second element, layer or film, the first element, layer or film may be formed or disposed directly on the second element, layer or film or there may be intervening element, layers or films between the first element, layer or film and the second element, layer or film. Further, as used herein, the term "formed on" is used with the same meaning as "located on" or "disposed on" and is not meant to be limiting regarding any particular fabrication process.

FIG. 1 is a cross-sectional diagram of an organic light emitting display apparatus 100 according to an embodiment of the present invention. Referring to FIG. 1, first electrodes 110 are formed on a substrate 101 and a pixel defining layer 115 is formed on the first electrodes 110. Intermediate layers 120 are formed on portions exposed by the pixel defining layer 115 and a second electrode 130 is formed on the intermediate layers 120.

Etching units 110a are formed on the surfaces of the first electrodes 110 facing the intermediate layers 120. More specifically, the etching units 110a are formed on the surfaces of the first electrodes 110 exposed by the pixel defining layer 115. The etching units 110a are formed on the first electrodes 110 so as to easily remove impurities remaining on the surfaces of the first electrodes 110. The first electrodes 110 include silver (Ag). In this case, the etching units 110a are formed so that silver (Ag) particles are not remaining on the surfaces of the first electrodes 110. The etching units 110a are formed on the surfaces of the first electrodes 110 that are exposed and not covered by the pixel defining layer 115 in order to prevent the sides and edges of the first electrodes 110 from being damaged.

A sealing member (not illustrated) may be disposed on the second electrode 130 to face one surface of the substrate 101. The sealing member is formed to protect an organic light emission layer from external moisture and oxygen and is formed of a transparent material. Accordingly, the sealing member is formed of glass, plastic, a stacked structure of an organic material and an inorganic layer, or other suitable materials.

A structure and method of manufacturing the organic light emitting display apparatus 100 is now described more fully with reference to FIGS. 2A through 2F. FIGS. 2A through 2F are cross-sectional diagrams sequentially illustrating a method of manufacturing the organic light emitting display apparatus 100 according to an embodiment of the present invention.

Figure 2A:
FIGS. 2A through 2F are cross-sectional diagrams sequentially illustrating a method of manufacturing the organic light emitting display apparatus of FIG. 1 according to an embodiment of the present invention.

Referring to FIG. 2A, the substrate 101 is prepared and is formed of a transparent glass material, such as $SiO_2$. However, aspects of the present invention are not limited thereto and the substrate 101 may be formed of a transparent plastic material or other suitable materials. The plastic material may include an organic material selected from the group consisting of insulating organic materials such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP), or other suitable materials.

Also, the substrate 101 may be formed of a metal. When the substrate 101 is formed of a metal, the substrate 101 may include at least one selected from the group consisting of carbon (c), iron (Fe), chromium (Cr), manganese (Mn), nickel (Ni), titanium (Ti), molybdenum (Mo), stainless steel (SUS), an Invar alloy, an Inconel alloy, and a Kovar alloy. However, aspects of the present invention are not limited thereto and the substrate 101 may be formed of a metal foil or other suitable materials. Although not illustrated, a buffer layer (not illustrated) may be formed on the substrate 101 in order to form a smooth surface on the substrate 101 and to prevent impurity elements from penetrating the substrate 101. The buffer layer may be formed of $SiO_2$, SiNx, or other suitable materials.

Figure 2B:
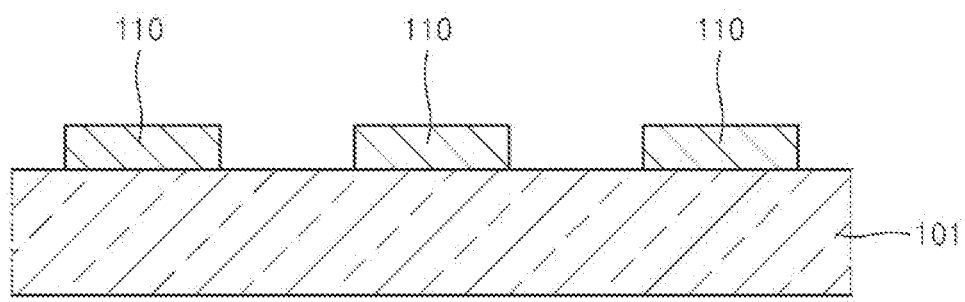

Referring to FIG. 2B, the first electrodes 110 are formed on the substrate 101. Before the first electrodes 110 are formed, a thin film transistor is formed on the substrate 101. The organic light emitting display apparatus 100, according to the current embodiment, is applied to both an active matrix apparatus and a passive matrix apparatus. The first electrodes 110 are patterned in a predetermined form. In the active matrix apparatus, the first electrodes 110 are patterned in a stripe form. In the passive matrix apparatus, the first electrodes 110 are patterned to correspond to each sub pixel. However, aspects of the present invention are not limited thereto and the first electrodes 110 may be configured in a variety of manners suitable for the active matrix apparatus and the passive matrix apparatus.

The first electrodes 110 include various materials, such as silver (Ag). When the first electrodes 110 include silver (Ag), visible rays radiating towards the first electrodes 110 from an intermediate layer 120 may be reflected toward the second electrode 130. Surfaces far from the substrate 101 from among the surfaces of the first electrode 110 facing the intermediate layer 120, may include ITO. However, aspects of the present invention are not limited thereto, and the surfaces of the first electrode 110 facing the intermediate layer 120 may include other suitable materials.

Figure 2C:
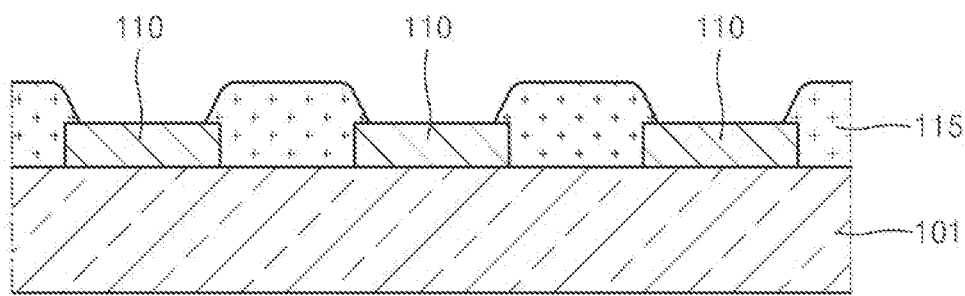

Referring to FIG. 2C, the pixel defining layer 115 is formed on the first electrodes 110. The pixel defining layer 115 is formed to expose predetermined areas of the first electrodes 110. The pixel defining layer 115 may be formed of various insulating materials, such as organic materials, inorganic materials or other suitable materials.

Figure 2D:
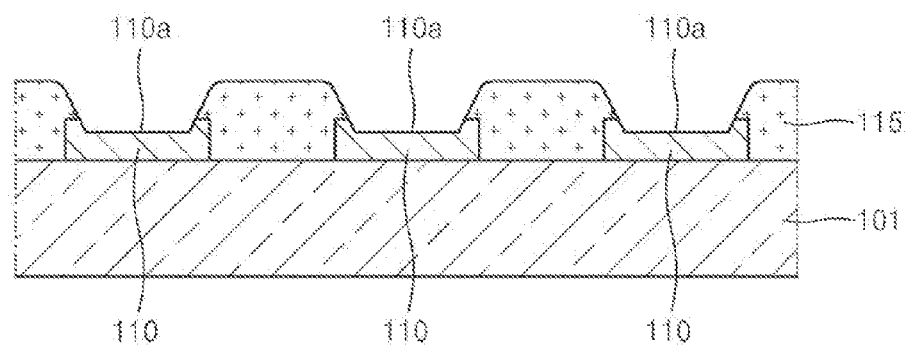

Referring to FIG. 2D, the etching units 110a are formed on the first electrodes 110. Although not illustrated, before the etching units 110a are formed, a process of crystallizing the surfaces of the first electrodes 110 is performed. The process of crystallizing the surfaces of the first electrodes 110 is performed by heat treatment or other suitable processes. As the surfaces of the first electrodes 110 include ITO, such a heat treatment is performed at a temperature that crystallizes the ITO. The etching units 110a are formed on the surfaces of the first electrodes 110 exposed by the pixel defining layer 115. The etching units 110a are formed by using an oxalic acid $C_2H_2O_4$.

During forming of the first electrodes 110, residual patterns may remain on the surfaces of the first electrodes 110. In particular, silver (Ag) components of the first electrodes 110 may remain. During forming of the etching units 110a using an oxalic acid $C_2H_2O_4$, impurities such as the silver (Ag) components remaining on the first electrodes 110 are easily removed. The pixel defining layer 115 prevents the sides and edges of the first electrodes 110 from being damaged by an oxalic acid $C_2H_2O_4$. Also, the surfaces of the first electrodes 110 are crystallized and thus are prevented from being excessively etched when the etching units 110a are formed by using an oxalic acid $C_2H_2O_4$. Thus, electrical characteristics of the first electrodes 110 are not affected.

Figure 2E:
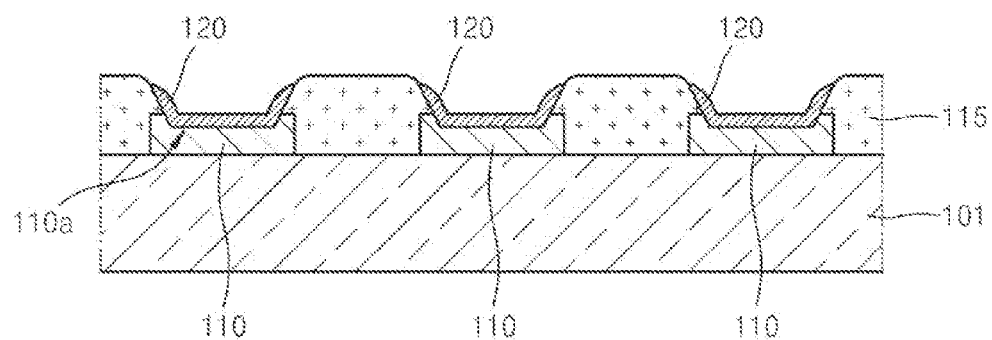
Figure 2F:
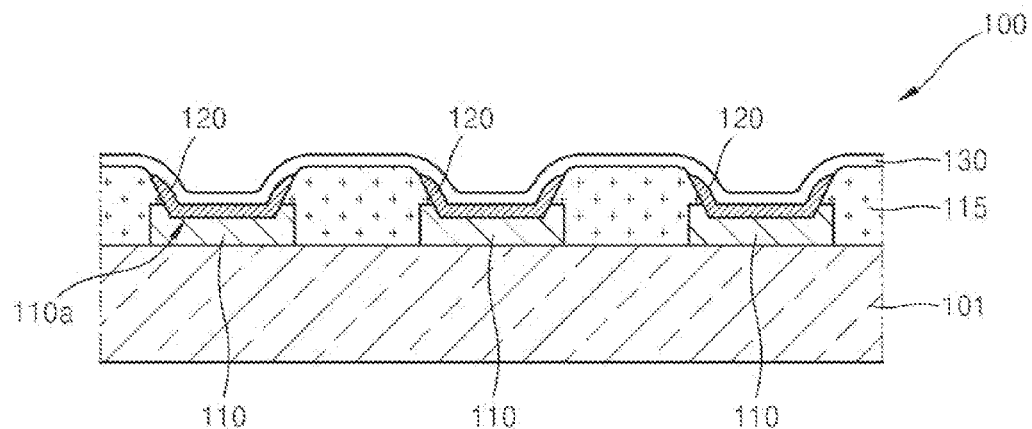

Referring to FIG. 2E, the intermediate layers 120 are formed on the first electrodes 110. The intermediate layers 120 each include an organic emission layer that emits visible rays and may be each formed of various materials. Then, the second electrode 130 is formed on the intermediate layers 120, and FIG. 2F illustrates the organic light emitting display apparatus 100.

The second electrode 130 is formed to cover all sub pixels. However, aspects of the present invention are not limited thereto, and the second electrode 130 may not cover all of the sub pixels. The second electrode 130 is formed by depositing a metal having a small work function, that is, silver (Ag), manganese (Mg), aluminum (Al), platinum (Pt), palladium (Pd), gold (Au), nickel (Ni), neodymium (Nd), iridium (Ir), chromium (Cr), lithium (Li), calcium (Ca), or a compound thereof and then depositing a transparent conductive material such as TO, IZO, ZnO, or In2O3 on the deposited metal. However, aspects of the present invention are not limited thereto, and the second electrode 130 may be formed of other suitable materials.

In the current embodiment, the first electrode 110 is an anode and the second electrode 130 is a cathode. However, aspects of the present invention are not limited thereto and the first electrode 110 may be a cathode and the second electrode 130 may be an anode. A sealing member (not illustrated) may be disposed on the second electrode 130 in order to face one surface of the substrate 101. The sealing member (not illustrated) is formed to protect an organic light emission layer from external moisture and oxygen and is formed of a transparent material. Accordingly, the sealing member may be formed of glass, plastic, or a stacked structure of an organic material and an inorganic layer, or other suitable materials.

In the current embodiment, the first electrodes 110 are formed and then the etching units 110a, which are formed so that residual patterns such as silver (Ag) remaining on the surfaces of the first electrodes 110 are easily removable. Accordingly, defects such as a dark spot are prevented and an image quality of the organic light emitting display apparatus 100 may be improved. In particular, the pixel defining layer 115 is formed and then the etching units 110a are formed so that the sides of the first electrode 110 are prevented from being damaged. Also, the surfaces of the first electrodes 110 are crystallized and are prevented from being excessively etched. Thus, electrical characteristics of the first electrodes 110 are not affected and thereby, an image quality property of the organic light emitting display apparatus 100 may be improved.

An oxalic acid used to form the etching units 110a completely removes silver (Ag) remaining on the first electrode 110 and has an etching capability to appropriately etch crystallized ITO so that the etching units 110a are formed in a desired form. Also, the etching units 110a are formed on the first electrodes 110 and thus the intermediate layers 120 are formed on the etching units 110a so that adhesive strength between the intermediate layers 120 and the first electrodes 110 may be improved.

Figure 3:
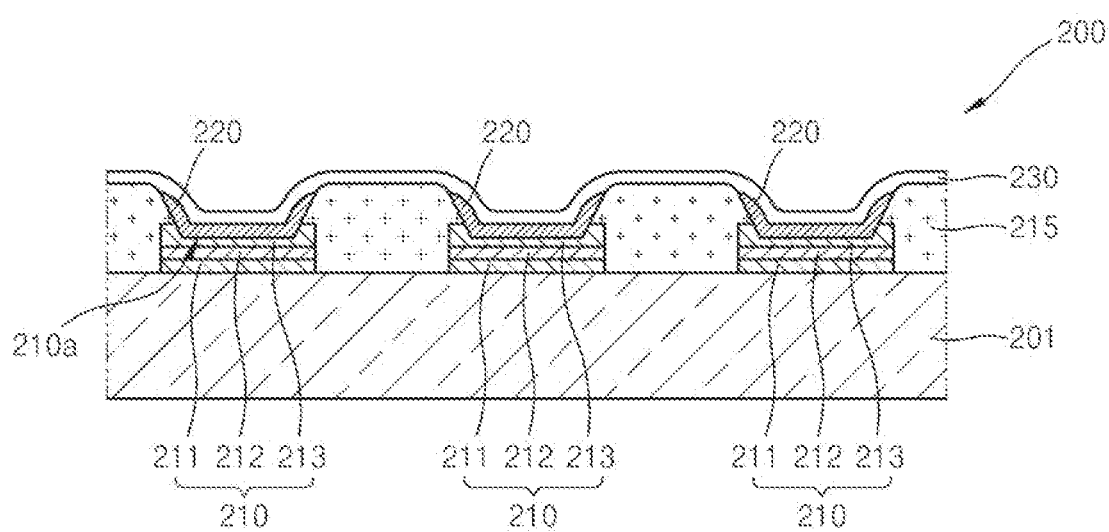
FIG. 3 is a cross-sectional diagram of an organic light emitting display apparatus according to another embodiment of the present invention.

FIG. 3 is a cross-sectional diagram of an organic light emitting display apparatus 200 according to another embodiment of the present invention. Referring to FIG. 3, first electrodes 210 are formed on a substrate 201 and a pixel defining layer 215 is formed on the first electrodes 210. Intermediate layers 220 are formed on portions exposed by the pixel defining layer 215 and a second electrode 230 is formed on the intermediate layers 220. The first electrodes 210 each include a first conductive layer 211, a second conductive layer 212, and a third conductive layer 213. The first conductive layer 211 and the third conductive layer 213 include ITO and the second conductive layer 212 may include silver (Ag).

Etching units 210a are formed on the surfaces of the first electrodes 210 facing the intermediate layers 220. More specifically, the etching units 210a are formed on the surfaces of the third conductive layer 213 exposed by the pixel defining layer 215 in the first electrodes 210. The etching units 210a are each formed on the third conductive layer 213 and thus impurities remaining on the surface of the third conductive layer 213 are easily removed. The etching units 210a are formed on the surfaces of the first electrodes 210 that are exposed and not covered by the pixel defining layer 215 in order to prevent the sides and edges of the first electrodes 210 being damaged.

A sealing member (not illustrated) is disposed on the second electrode 230 in order to face one surface of the substrate 201. The sealing member (not illustrated) is formed to protect an organic light emission layer from external moisture and oxygen and is formed of a transparent material. Accordingly, the sealing member is formed of glass, plastic, or a stacked structure of an organic material and an inorganic layer. However, aspects of the present invention are not limited thereto, and the sealing member may be formed of other suitable materials, and in other suitable structures.

Figure 4A:
FIGS. 4A through 4F are cross-sectional diagrams sequentially illustrating a method of manufacturing an organic light emitting display apparatus according to another embodiment of the present invention.

A structure and method of manufacturing the organic light emitting display apparatus 200 is now described more fully with reference to FIGS. 4A through 4F. FIGS. 4A through 4F are cross-sectional diagrams sequentially illustrating a method of manufacturing the organic light emitting display apparatus 200 according to another embodiment of the present invention. Referring to FIG. 4A, the substrate 201 is prepared, wherein a material forming the substrate 201 is the same as the material described in the previous embodiment and thus a detailed description thereof is omitted. A buffer layer (not illustrated) may be formed on the substrate 201.

Figure 4B:
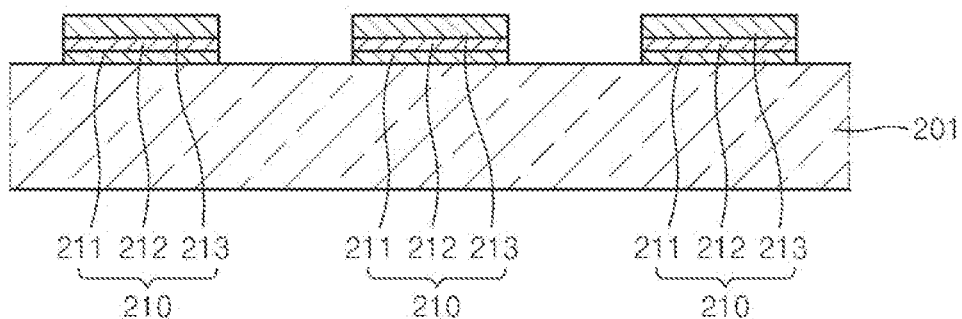

Referring to FIG. 4B, the first electrodes 210 are formed on the substrate 201. The first electrodes 210 are patterned in a predetermined form. In the active matrix apparatus, the first electrodes 210 are patterned in a stripe form. In the passive matrix apparatus, the first electrodes 210 are patterned to correspond to each sub pixel. However, aspects of the present invention are not limited thereto, and the first electrodes 210 may be patterned in other suitable patterns. The first electrodes 210 each include the first conductive layer 211, the second conductive layer 212, and the third conductive layer 213.

The first conductive layer 211 includes ITO and accordingly, adhesive strength between the first electrodes 210 and the substrate 201 may be improved. When another insulating layer is interposed between the substrate 201 and the first electrodes 210, adhesive strength between the insulating layer and the first electrodes 210 also may be improved. The second conductive layer 212 formed on the first conductive layer 211 includes silver (Ag). The second conductive layer 212 allows visible rays radiating towards the first electrodes 210 from an intermediate layer 220 to be reflected toward the second electrode 230. The third conductive layer 213 formed on the second conductive layer 212 includes ITO.

Figure 4C:
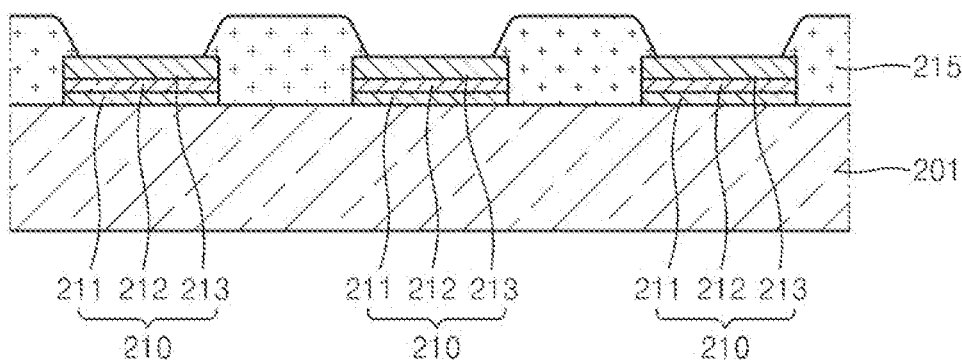
Figure 4D:
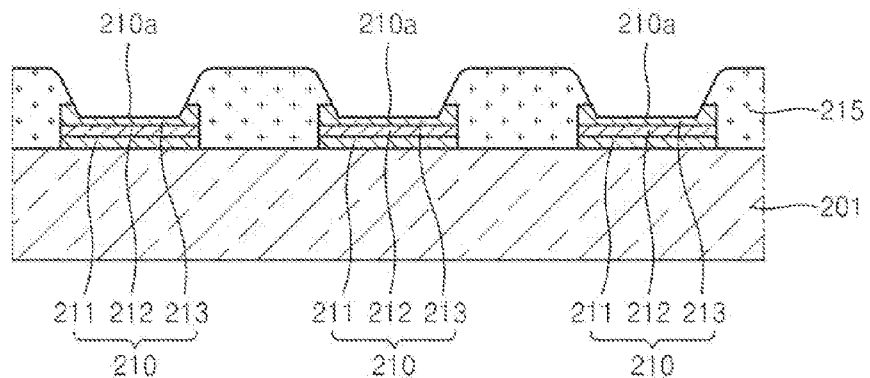

Referring to FIG. 4C, the pixel defining layer 215 is formed on the first electrodes 210. The pixel defining layer 215 is formed to expose predetermined areas of the first electrodes 210. Referring to FIG. 4D, the etching units 210a are formed on the first electrodes 210.

Although not illustrated, before the etching units 210a are formed, the surfaces of the first electrodes 210 are crystallized. That is, the third conductive layer 213 of the first electrode 210 is crystallized. A process of crystallizing the surfaces of the first electrodes 210 is performed by heat treatment, or may be performed by other suitable processes. As the third conductive layer 213 of the first electrode 210 includes ITO, such a heat treatment is performed at a temperature that crystallizes the ITO. The etching units 210a are formed on the surfaces of the first electrodes 210 exposed by the pixel defining layer 215. More specifically, the etching units 210a are formed on the third conductive layer 213 of the first electrode 210.

The etching units 210a are formed by using an oxalic acid $C_2H_2O_4$. During forming of the first electrodes 210, residual patterns may remain on the surfaces of the first electrodes 210. In particular, silver (Ag) components included in the second conductive layer 212 of the first electrode 110 may remain. During forming of the etching units 210a by using an oxalic acid, impurities such as the silver (Ag) component remaining on the first electrodes 210 is easily removable. Here, the pixel defining g layer 215 prevents the sides and edges of the first electrodes 210 from being damaged by an oxalic acid. Also, the third conductive layer 213 of the first electrode 210 is crystallized and is prevented from being excessively etched when the etching units 210a are formed using the oxalic acid. Thus, electrical characteristics of the first electrodes 210 are not affected.

Figure 4E:
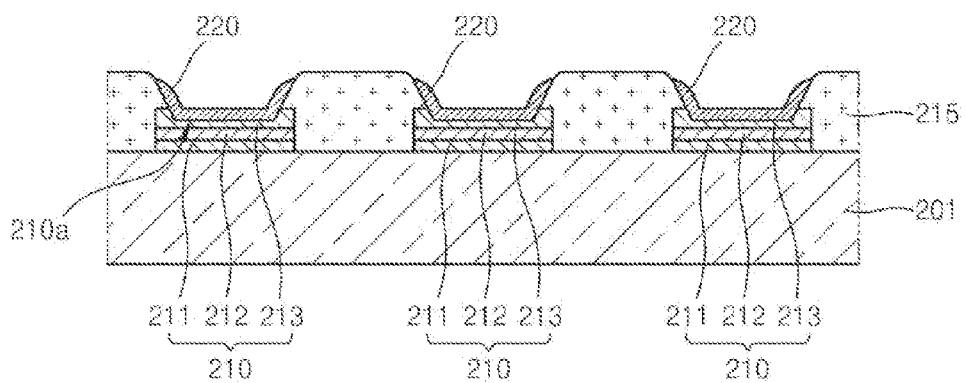
Figure 4F:
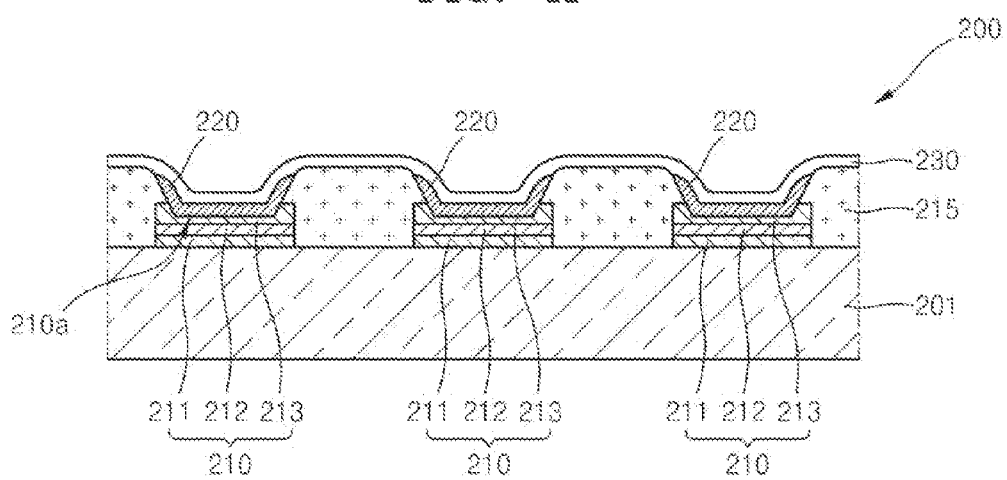

Referring to FIG. 4E, the intermediate layers 220 are formed on the first electrodes 210. The intermediate layers 220 each include an organic emission layer that emits visible rays and may be each formed of various materials. The second electrode 230 is formed on the intermediate layers 220, thereby completing the organic light emitting display apparatus 200, as illustrated in FIG. 4F. In the current embodiment, the first electrode 210 is an anode and the second electrode 230 is a cathode. However, aspects of the present invention are not limited thereto and the first electrode 210 may be a cathode and the second electrode 230 may be an anode.

A sealing member (not illustrated) may be disposed on the second electrode 230 in order to face one surface of the substrate 201. The sealing member (not illustrated) is formed to protect an organic light emission layer from external moisture and oxygen and is formed of a transparent material. Accordingly, the sealing member is formed of glass, plastic, or a stacked structure of an organic material and an inorganic layer, or other suitable materials and in other suitable structures.

In the current embodiment, the first electrodes 210 are formed and then the etching units 210a are formed so that residual patterns such as silver (Ag), which is a forming material of the second conductive layer 212, remaining on the surfaces of the first electrodes 210 are easily removable. In particular, the pixel defining layer 215 is formed and then the etching units 210a are formed so that the sides of the first electrodes 210 are prevented from being damaged. Also, the third conductive layer 213 of the first electrode 210 is crystallized and is prevented from being excessively etched. Thus, electrical characteristics of the first electrodes 210 are not affected and an image quality of the organic light emitting display apparatus 200 may be improved.

An oxalic acid used to form the etching units 210a completely removes silver (Ag) remaining on the first electrode 210 and has an etching capability to appropriately etch crystallized ITO so that the etching units 210a are easily formed in a desired form. Also, the etching units 210a are formed on the first electrodes 210 and thus the intermediate layers 220 are formed on the etching units 210a so that adhesive strength between the intermediate layers 220 and the first electrodes 210 may be improved. In the organic light emitting display apparatus and method of manufacturing the same according to the present invention, an image quality may be improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light emitting display apparatus, the method comprising:
    forming a first electrode on a substrate;
    forming a pixel defining layer on the first electrode so as to expose a predetermined area of the first electrode after forming the first electrode and before forming an intermediate layer;
    crystallizing the surface of the exposed predetermined area of the first electrode;
    etching the crystallized surface of the exposed predetermined area of the first electrode;
    forming the intermediate layer on the etched crystallized surface of the exposed predetermined area of the first electrode, the intermediate layer having an organic emission layer; and
    forming a second electrode on the intermediate layer.

2. The method of claim 1, wherein the etching is formed by wet etching the exposed predetermined area of the first electrode.

3. The method of claim 1, wherein the etching is formed by an oxalic acid.

4. The method of claim 1, wherein the first electrode comprises silver (Ag).

5. The method of claim 1, further comprising crystallizing the surface of the first electrode before forming the etching on the first electrode.

6. The method of claim 5, wherein a surface of the first electrode comprises ITO, and
    wherein the crystallizing of the first electrode comprises crystallizing the ITO.

7. The method of claim 5, wherein the crystallizing the surface of the first electrode is performed by a heat treatment.

8. The method of claim 1, wherein the first electrode comprises:
- a first conductive layer;
- a second conductive layer; and
- a third conductive layer,
- wherein the first electrode is formed in a stacked structure stacking the first conductive layer, the second conductive layer, and the third conductive layer,
- wherein the first conductive layer and the third conductive layer comprise ITO, and
- wherein the second conductive layer comprises silver (Ag).

9. The method of claim 8, wherein the third conductive layer is etched.

10. The method of claim 1, wherein edges of pixel defining layer overlap edges of the first electrodes.

11. The method of claim 1, wherein the intermediate layer contact the pixel defining layer at areae of the pixel defining layer overlapping the first electrode.

* * * * *